United States Patent
Otaguro

(10) Patent No.: US 6,824,344 B2
(45) Date of Patent: Nov. 30, 2004

(54) DRIVE-SECTION-ISOLATED FOUP OPENER

(75) Inventor: Tetsunori Otaguro, Tokyo (JP)

(73) Assignee: Hirata Corporation (JP)

( * ) Notice: Subject to any disclaimer, the term of this patent is extended or adjusted under 35 U.S.C. 154(b) by 58 days.

(21) Appl. No.: 09/977,394

(22) Filed: Oct. 16, 2001

(65) Prior Publication Data

US 2002/0064439 A1 May 30, 2002

(30) Foreign Application Priority Data

Nov. 30, 2000 (JP) ........................................ 2000-364239

(51) Int. Cl.$^7$ ............................................... G01V 9/04
(52) U.S. Cl. .................................... 414/217.1; 414/416
(58) Field of Search ............................. 414/217.1, 940, 414/939, 98, 405, 416, 217

(56) References Cited

U.S. PATENT DOCUMENTS

| | | | |
|---|---|---|---|
| 5,239,182 A | * | 8/1993 | Tateyama et al. ...... 250/559.37 |
| 5,308,993 A | * | 5/1994 | Holman et al. .......... 250/559.4 |
| 5,905,302 A | * | 5/1999 | Lane et al. .................. 257/678 |
| 6,013,920 A | * | 1/2000 | Gordon et al. ......... 250/559.36 |
| 6,042,324 A | * | 3/2000 | Aggarwal et al. .......... 414/411 |
| 6,082,951 A | * | 7/2000 | Nering et al. ............. 414/217.1 |
| 6,281,516 B1 | * | 8/2001 | Bacchi et al. .......... 250/559.29 |
| 6,396,072 B1 | * | 5/2002 | Meyhofer et al. ....... 250/559.4 |
| 6,470,927 B2 | * | 10/2002 | Otaguro ........................ 141/98 |
| 6,641,350 B2 | * | 11/2003 | Nakashima et al. ........ 414/217 |

FOREIGN PATENT DOCUMENTS

| | | |
|---|---|---|
| JP | 11-145244 | 5/1999 |
| WO | 99/28965 | 10/1999 |

* cited by examiner

*Primary Examiner*—Eileen D. Lillis
*Assistant Examiner*—Charles A. Fox
(74) *Attorney, Agent, or Firm*—Lorusso, Loud & Kelly

(57) ABSTRACT

A drive-section-isolated FOUP opener opens and closes a door of a FOUP which contains a plurality of semiconductor wafers. The FOUP opener includes a dock plate for carrying and positioning the FOUP; a dock moving mechanism for moving the dock plate to a position for detachment/attachment of the FOUP door; a port door including a mechanism for releasably holding the FOUP door; a port plate including an opening closed by the port door; a port door horizontal-movement mechanism for horizontally moving the port door; a sensor horizontal-movement mechanism for horizontally moving a sensor bracket, the sensor bracket carrying a mapping sensor; and a port-door-and-sensor vertical-movement mechanism for vertically moving the port door and the sensor bracket with the port door holding the FOUP door. A drive for the port door horizontal-movement mechanism, a drive for the sensor horizontal-movement mechanism, and a drive for the port-door-and-sensor vertical-movement mechanism are disposed opposite a clean room with respect to the port plate.

13 Claims, 6 Drawing Sheets

F I G. 1
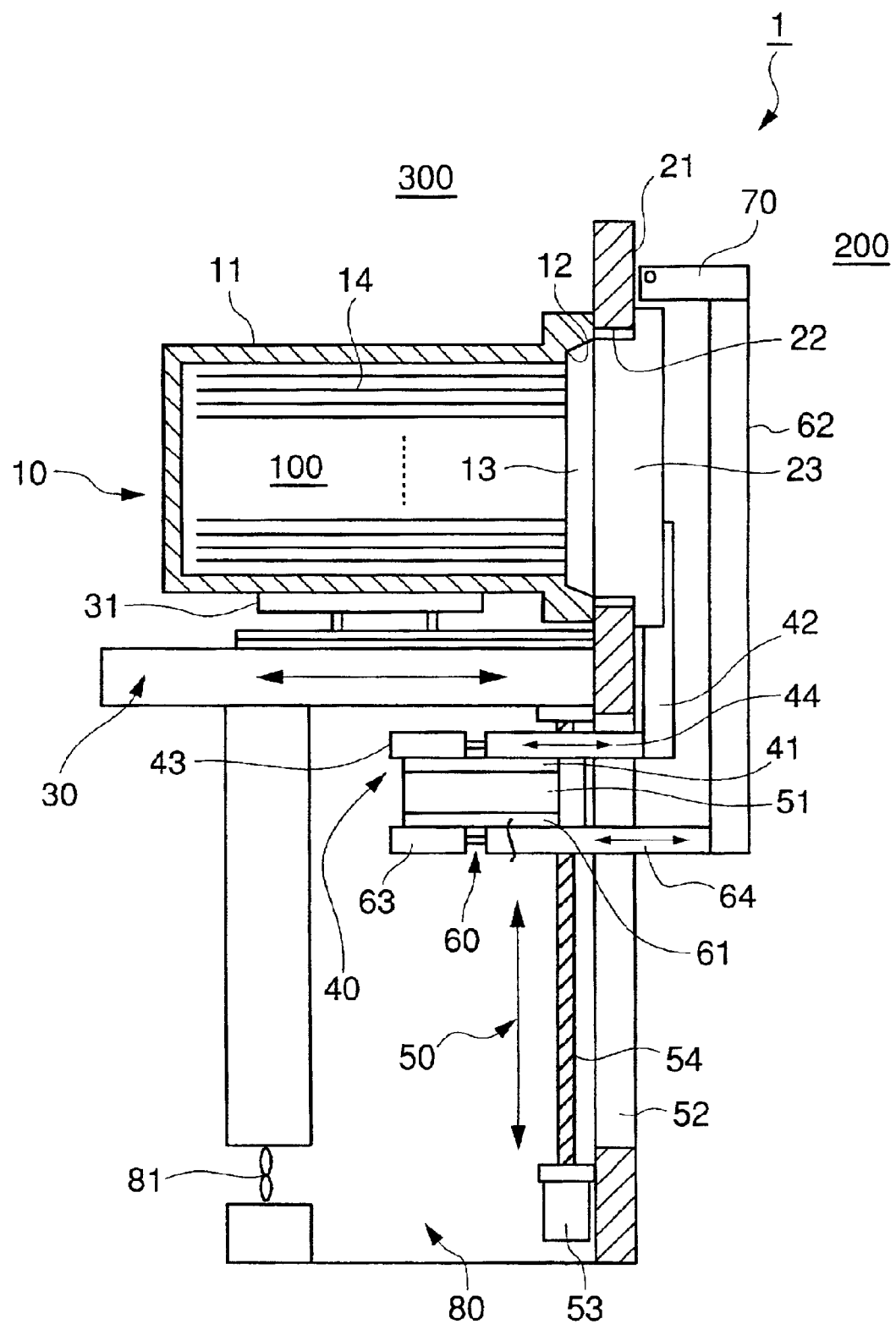

F I G. 3
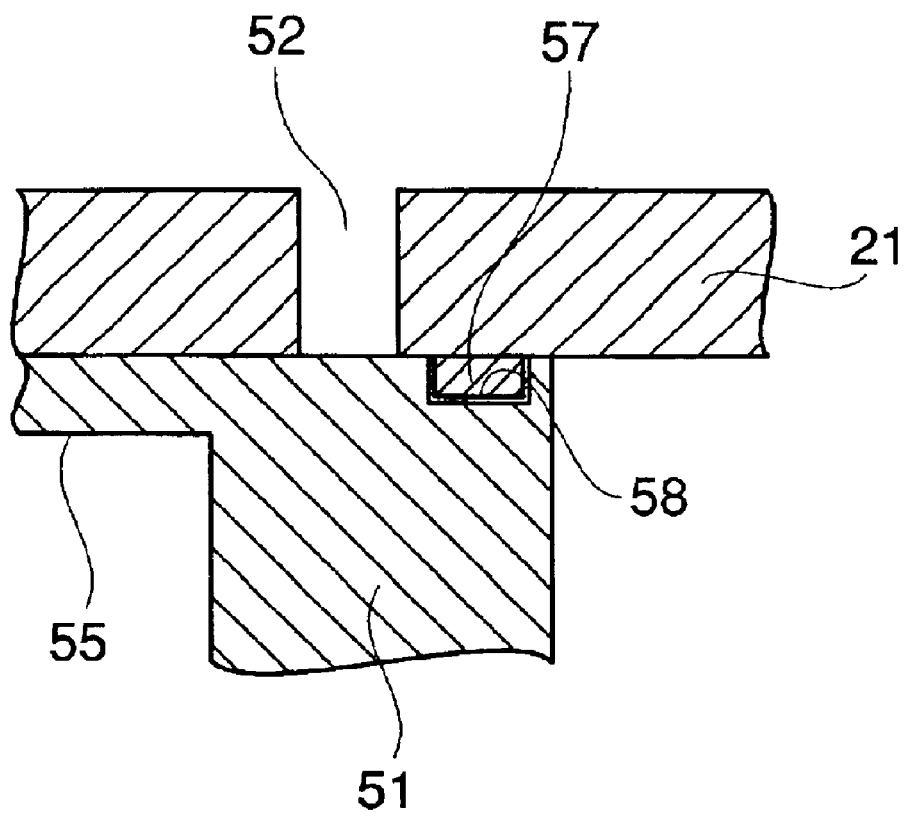

DRIVE-SECTION-ISOLATED FOUP OPENER

BACKGROUND OF THE INVENTION

1. Field of the Invention

The present invention relates to a container opener for opening/closing a sealable container for containing and transferring a plurality of semiconductor wafers oriented horizontally and vertically arranged at predetermined intervals. More particularly, the invention relates to a front opening unified pod (FOUP) opener having a structure such that a drive section for a port door including a detachment/attachment mechanism for detaching/attaching a FOUP door and a holder mechanism for holding the FOUP door, and a drive section for a sensor mechanism for detecting presence/absence, storage condition, and position of wafers contained in the FOUP are arranged in an improved manner.

2. Description of the Related Art

A FOUP opener is adapted to establish communication between a space (a first control space) within a FOUP and a wafer transfer space (a second control space) and to enable transfer of wafers from the first control space to the second control space without exposure to the ambient atmosphere, by means of, for example, a robot. When the wafers are highly-precise wafers having a diameter of 300 mm or more, since such wafers are very expensive, the FOUP opener must satisfy a strict requirement for protection against wafer contamination with dust, specifically, dust particles generated by the FOUP opener itself must be reduced to one particle/b cft or less (0.1 $\mu$m particles), and the mapping report error rate must be decreased to once/0.1–1 million wafers or less. In order to detect presence/absence, storage condition, or position of wafers contained in the FOUP before transfer of the wafers, mapping means is provided on either the FOUP opener or a robot. Generally, provision of the mapping means is optional for the FOUP opener and the robot.

FIG. 5 shows a conventional FOUP opener. As shown in FIG. 5, operation of a FOUP opener 01 for detaching a FOUP door 013 from and attaching the FOUP door 013 to/from an opening of a FOUP 010 and for moving the FOUP door 013 vertically is performed within a second control space 200 that maintains a clean room atmosphere. Accordingly, a drive section of a horizontal-movement mechanism 040 for moving a port door 023 and a sensor 070 horizontally and a drive section of a vertical-movement mechanism 050 for moving the port door 023 and the sensor 070 vertically are disposed within the second control space 200. The port door 023 includes a detachment/attachment mechanism for detaching/attaching the FOUP door 013 and a holder mechanism for holding the FOUP door 013 (see Japanese Patent Application Laid-Open (Kokai) No. 11-145244). Reference numeral 014 denotes a semiconductor wafer, reference numeral 021 denotes a port plate, and reference numeral 300 denotes the ambient atmosphere.

Thus, there has been the problem that the drives, which are dust generators, contaminate the second control space 200, which must maintain a clean atmosphere. For example, when a movable member is actuated by a motor or cylinder of a drive section, friction causes generation of dust, which is scattered within a clean room (the second control space 200). Also, an organic substance generated through vaporization of a lubricant applied to a movable member may be scattered within the clean room 200. As a result, the clean room 200 fails to maintain a high level of cleanliness. Furthermore, when the drive sections are to be serviced for maintenance, inspection, or repairs, within the clean room 200, a worker must move or remove equipment in order to establish work space within the clean room 200, resulting in scattering of dust within the clean room 200. Thus, restoration of cleanliness within the clean room 200 to a regular, high level consumes a considerably great amount of time and cost. In order to enable a worker to work within the clean room 200, equipment for removing dust from the worker must be installed, thus incurring further cost.

In order to cope with the above problem, a FOUP opener as shown in FIG. 6 has been proposed (see Japanese kohyo (PCT) Patent Published (re-published) No. W099/28965). As shown in FIG. 6, a port door is disposed outside a clean room (a second control space 200) for opening/closing and vertical movement of a FOUP door outside the clean room 200. However, since a port door 023 is located between a FOUP 010 and a port plate 021, a gap g is formed therebetween. The gap g creates the possibility of entry of dust into the FOUP 010 (first control space 100) and into the clean room 200 from outside the clean room 200 (from the ambient atmosphere 300), possible adhesion of the dust to the inside surface of FOUP door 013 and to the outside surface of the port door 023, and possible outflow of a large amount of highly clean air to the exterior of the clean room 200.

In the case of the FOUP opener 01 of the patent publication, as the gap g between the FOUP 010 and the port plate 021 becomes larger, the positioning accuracy of the FOUP 010 is reduced due to machining errors, assembly errors, and wear of dock plate 031 for carrying and positioning the FOUP 010 and components of a dock moving mechanism 030. Thus, the presence/absence, storage condition, and position of wafers 014 contained in the FOUP 010 cannot be detected with high accuracy, thus creating possible problems in transfer of the wafers 014.

SUMMARY OF THE INVENTION

An object of the present invention is to solve the above-mentioned problems in the conventional FOUP openers and to provide a FOUP opener which does not cause contamination of a clean room (a second control space) by contaminants generated by drives of horizontal- and vertical-movement mechanisms for a port door and a sensor; which does not allow entry of dust into a FOUP (first control space) or into the clean room from the ambient atmosphere.

Another object is to prevent adhesion of dust to the inside surface of a FOUP door and to the outside surface of the port door.

Yet another object is to prevent outflow of a large amount of highly clean air to the exterior of the clean room.

Still another object is to reduce the gap between the FOUP and a port plate, to thereby avoid impairment of accuracy in positioning of the FOUP due to machining errors, assembly errors, and wear of a dock plate and components of a dock moving mechanism, so that a mapping sensor can maintain high detection accuracy to avoid possible problems in transfer of the wafers.

To achieve the above objects, the present invention provides a drive-section-isolated FOUP opener for opening and closing a FOUP door which closes a front opening portion of a FOUP containing a plurality of semiconductor wafers oriented horizontally and vertically arranged at predetermined intervals. The FOUP opener comprises a dock plate for carrying and positioning the FOUP; a dock moving mechanism for moving the dock plate to a position for detachment and attachment of the FOUP door; a port door including a detachment/attachment mechanism for detaching and attaching the FOUP door and a holder mechanism for holding the FOUP door; a port plate including an opening, the opening being closed by the port door; a port door horizontal-movement mechanism for horizontally moving the port door; a sensor horizontal-movement mechanism for horizontally moving a sensor bracket, the sensor bracket having a mapping sensor mounted on an upper portion thereof and adapted to detect presence/absence, storage condition, and position of wafers contained in the FOUP; and a port-door-and-sensor vertical-movement mechanism for vertically moving the port door and the sensor bracket with the port door holding the FOUP door. A drive section of the port door horizontal-movement mechanism, a drive section of the sensor horizontal-movement mechanism, and a drive section of the port-door-and-sensor vertical-movement mechanism are disposed on the opposite side of the port plate relative to a clean room, with the clean room housing the port door and the sensor bracket.

Thus, in the drive-section-isolated FOUP opener of the present invention, the drive section of the port door horizontal-movement mechanism, the drive section of the sensor horizontal-movement mechanism, and the drive section of the port-door-and-sensor vertical-movement mechanism are disposed outside the clean room (the second control space), which houses the port door and the sensor bracket, i.e., on the side of the port plate opposite the clean room and thereby isolated from the clean room.

As a result, the port plate prevents dust generated by the drive sections from entry into the clean room. For example, when a movable member actuated by a motor or cylinder of a drive section generates dust through friction, the dust is not scattered into the clean room. Also, an organic substance generated through vaporization of a lubricant applied to a movable member does not enter the clean room. Furthermore, when the drive sections are to be serviced for maintenance, inspection, or repairs, a worker does not need to enter the clean room; i.e., the worker does not need to move or remove equipment in order to establish work space within the clean room, thereby avoiding contamination of the clean room with dust associated with such work. Therefore, the clean room can maintain a high level of cleanliness.

Since a worker does not need to enter the clean room when the drive sections are to be serviced for maintenance, inspection, or repairs, there is no need to install equipment for removing dust from the worker who is to enter the clean room for performing service work, thereby lowering equipment expenses.

Since the port door is disposed within the clean room, the gap between the FOUP and the port plate can be zero or very small. Because the gap therebetween is very small, entry of dust into the FOUP (first control space) and into the clean room from ambient atmosphere is avoided, along with avoidance of adhesion of the dust to the inside surface of the FOUP door and the outside surface of the port door as well as outflow of a large amount of highly clean air from the clean room. Thus, the clean room can more reliably maintain a high level of cleanliness.

Furthermore, since the gap between the FOUP and the port plate is small, inaccuracy in positioning of the FOUP due to machining errors, assembly errors, and wear of the dock plate and components of the dock moving mechanism can be avoided. Thus, the mapping sensor can maintain high detection accuracy, so that wafers can be transferred with high reliability.

Preferably, the port plate has a vertically extending guide slit located underneath its opening, and the drive section of the port door horizontal-movement mechanism, the drive section of the sensor horizontal-movement mechanism, and the drive section of the port-door-and-sensor vertical-movement mechanism move the port door and the sensor bracket horizontally or vertically, via the guide slit.

Thus, entry of dust into the clean room through the guide slit from outside the clean room and outflow of a large amount of highly clean air to the exterior of the clean room through the guide slit can be suppressed to the greatest possible extent, thereby contributing to the maintenance of a high level of cleanliness in the clean room. While arms of the port door and sensor bracket move along the guide slit, thereby possibly generating dust, the dust can be ejected to the exterior of the clean room from the guide slit through employment of a clean room pressure (a positive clean room pressure) higher than pressure outside the clean room. Thus, this feature also contributes to the maintenance of a high level of cleanliness in the clean room.

Preferably, the guide slit is used in common for moving the port door and the sensor bracket. Thus, the number of guide slits can be minimized to thereby enhance the aforementioned effects.

Preferably, the drive-section-isolated FOUP opener of the present invention further comprises a drive section chamber for housing the drive section of the port door horizontal-movement mechanism, the drive section of the sensor horizontal-movement mechanism, and the drive section of the port-door-and-sensor vertical-movement mechanism. The drive section chamber includes a device for exhausting atmosphere from the drive section chamber to the exterior. Thus, entry of dust generated in the drive sections into the clean room through the guide slit can be completely prevented, thereby more reliably maintaining the clean room at a high level of cleanliness.

BRIEF DESCRIPTION OF THE DRAWINGS

FIG. 1 is a schematic sectional view of a drive-section-isolated FOUP opener according to an embodiment of the present invention with the FOUP door closed;

FIG. 3 is a sectional view taken along line III—III of FIG. 2;

DESCRIPTION OF THE PREFERRED EMBODIMENT

Figure 2:
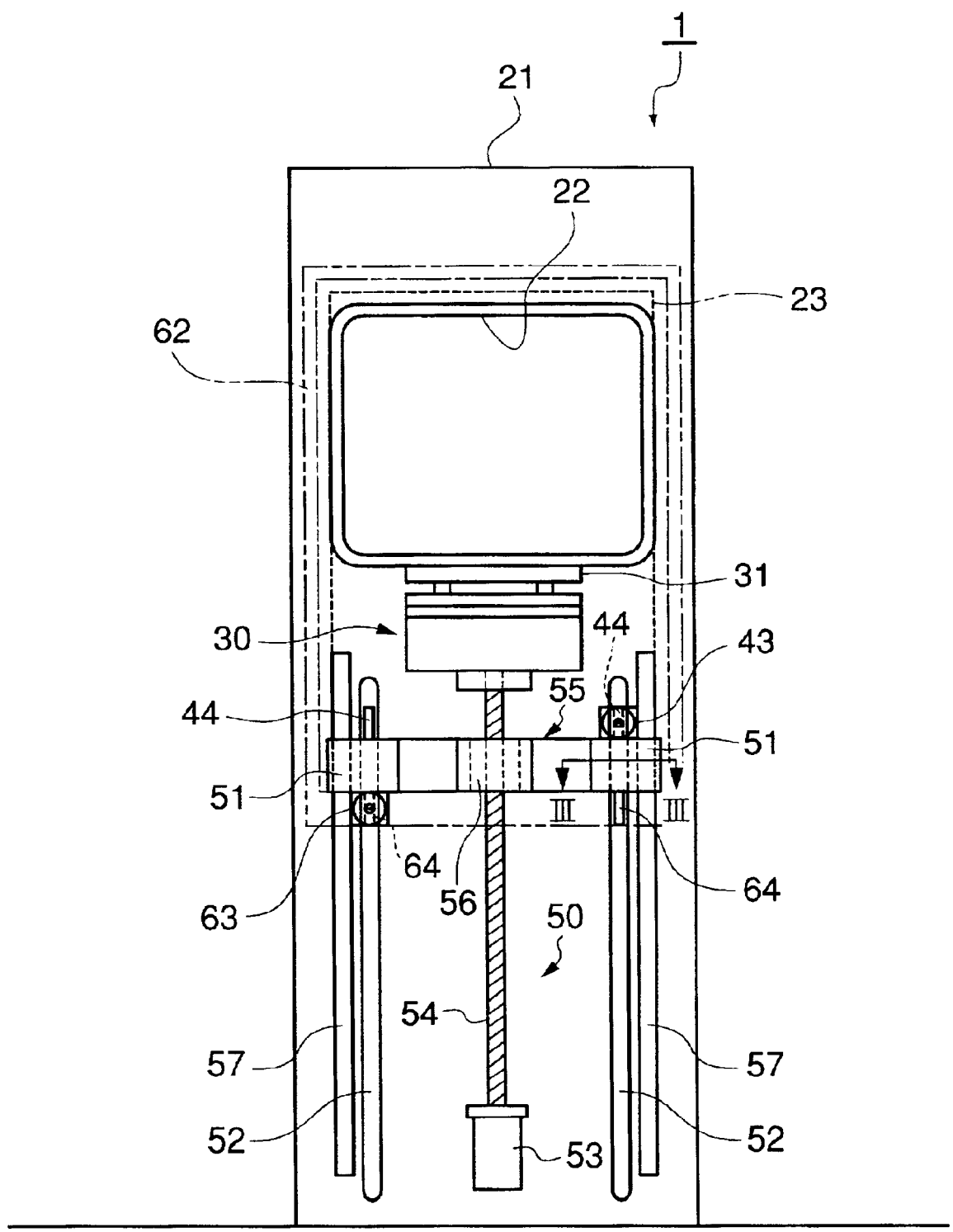
FIG. 2 is a schematic rear view of the FOUP opener of FIG. 1 as viewed with a drive section chamber wall removed.

An embodiment of the present invention will next be described in detail with reference to the drawings.

As shown in FIG. 1, a drive-section-isolated FOUP opener 1 of the present embodiment includes a FOUP 10 containing a plurality of semiconductor wafers 14 oriented horizontally and vertically arranged at predetermined intervals; a dock plate 31 for carrying and positioning the FOUP 10; a dock moving mechanism 30 for moving the dock plate 31 to a position for detachment/attachment of a FOUP door 13; a port door 23 including a detachment/attachment mechanism (not shown) for detaching/attaching the FOUP door 13 and a holder mechanism (not shown) for holding the FOUP door 13; a port plate 21 including an opening 22, the opening 22 being closed by the port door 23; a port door horizontal-movement mechanism 40 for horizontally moving the port door 23; a sensor horizontal-movement mechanism 60 for horizontally moving a sensor bracket 62, the sensor bracket 62 having a mapping sensor 70 mounted on an upper portion thereof, the mapping sensor 70 being operative to detect presence/absence, storage condition, and position of the wafers 14 contained in the FOUP 10; and a port-door-and-sensor vertical-movement mechanism 50 for vertically moving the port door 23 and the sensor bracket 62 with the port door 23 holding the FOUP door 13, so as to house the FOUP door 13 in a front end (a second control space 200).

Figure 4:
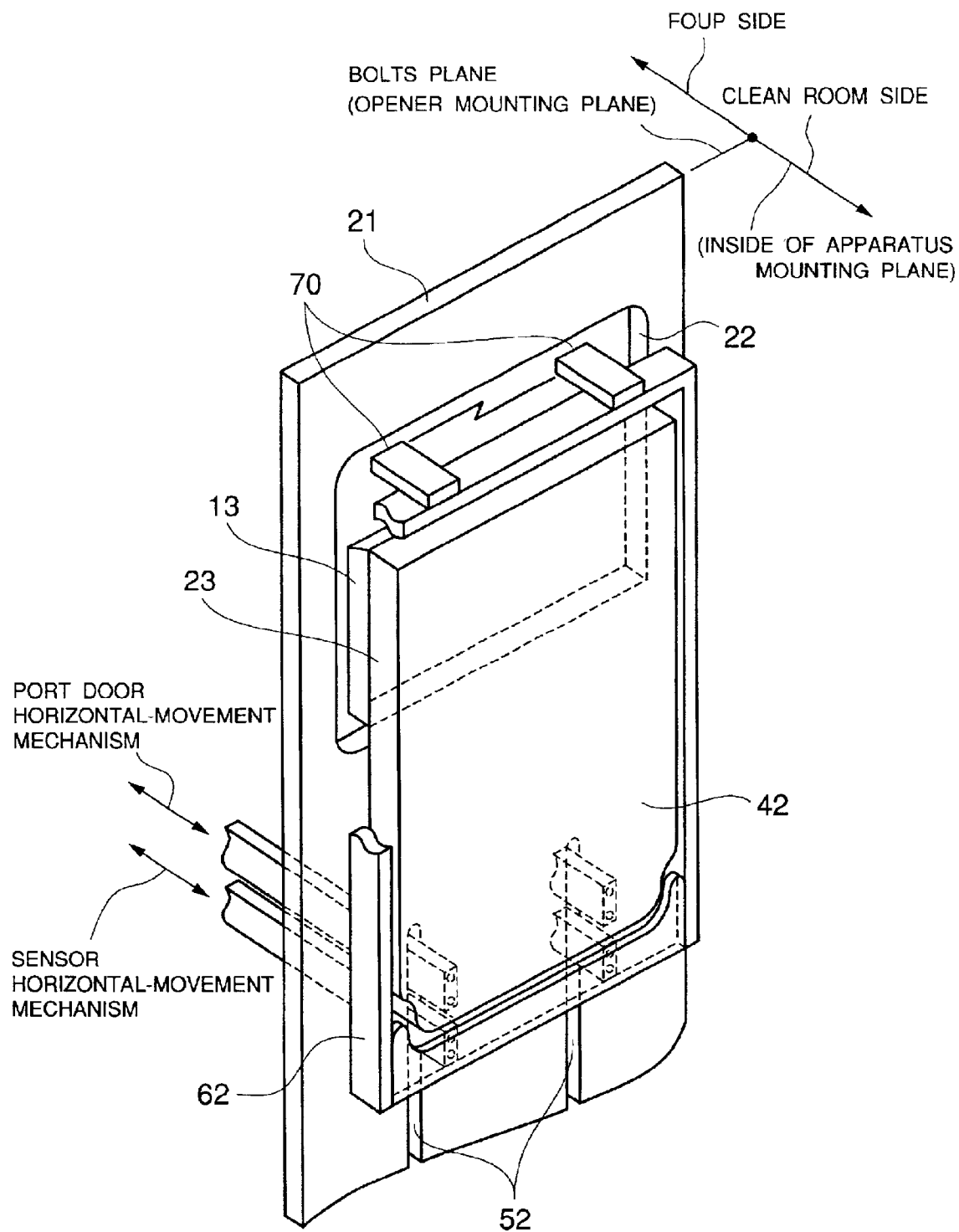
FIG. 4 is a schematic partial perspective view of the FOUP opener of FIG. 1 as viewed from the port door side.
Figure 5:
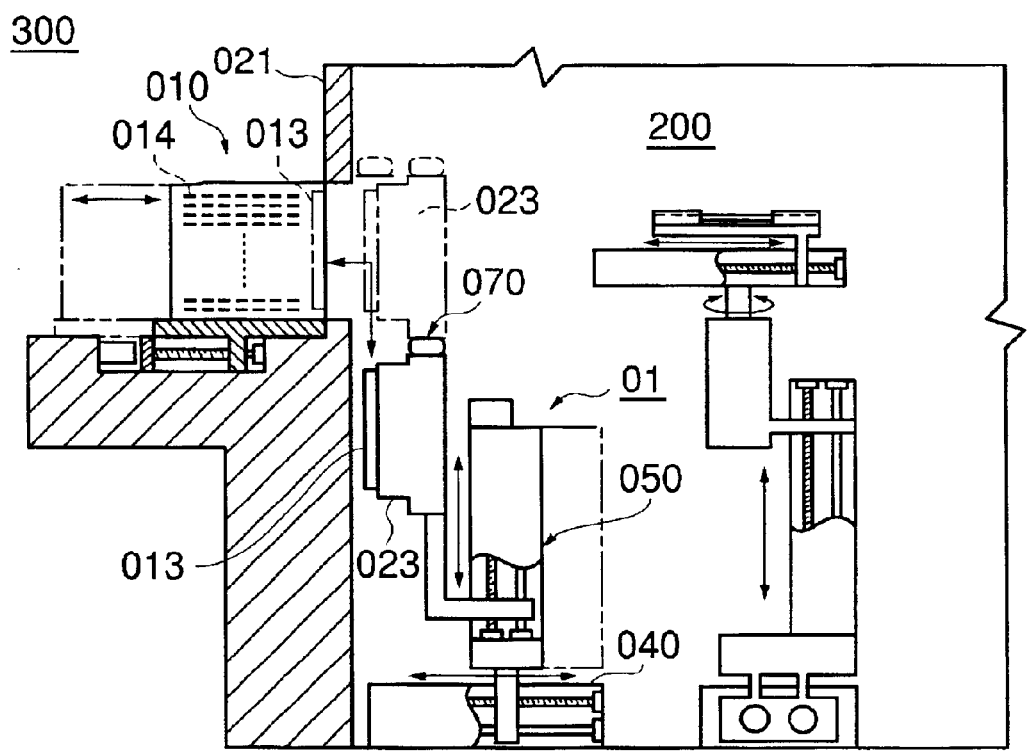
FIG. 5 is a view of a conventional FOUP opener.
Figure 6:
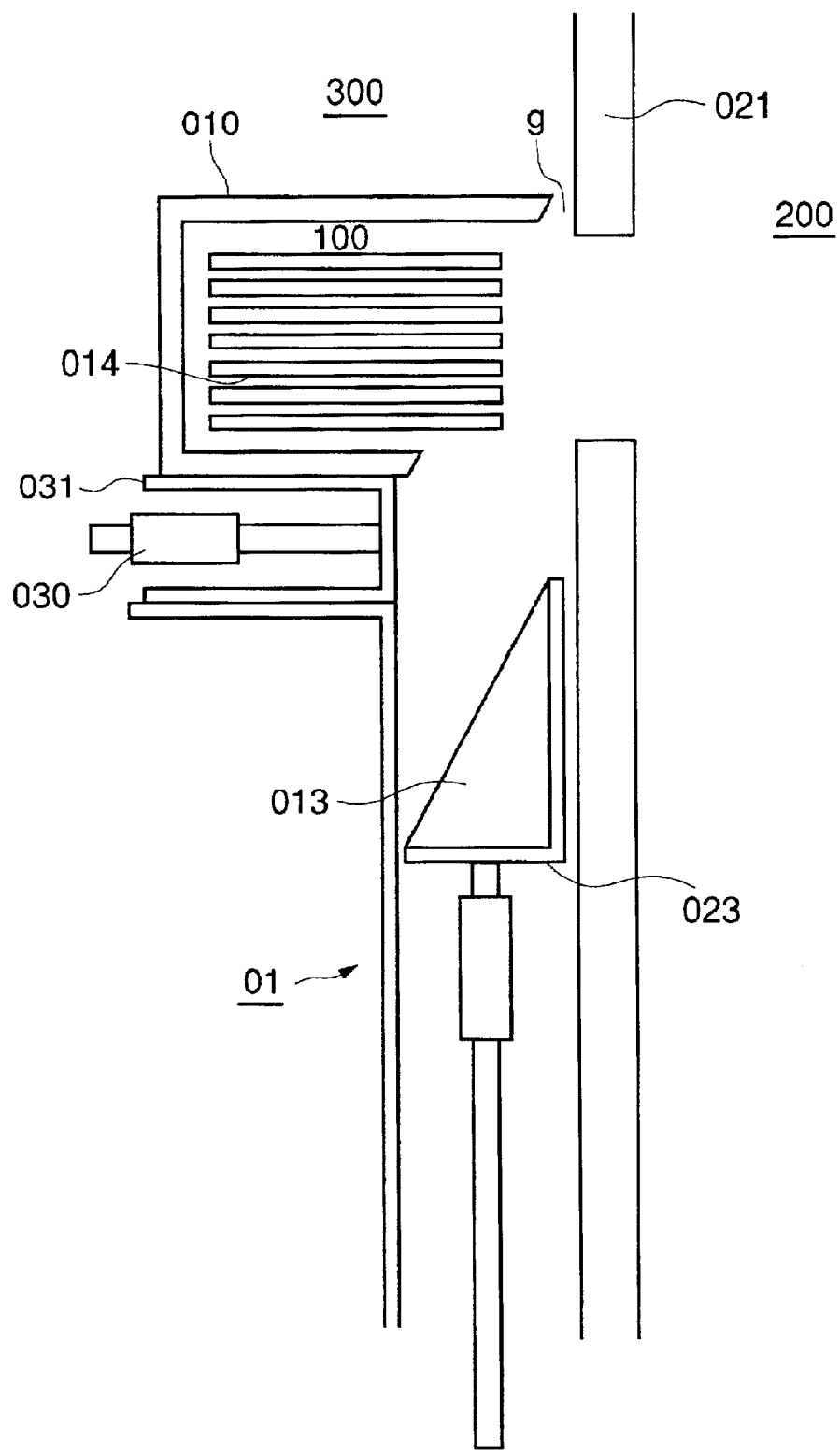
FIG. 6 is a view of another conventional FOUP opener.

The FOUP 10 assumes the form of a sealed container when a front opening 12 of a FOUP frame 11, serving as the body of the FOUP 10, is closed by the FOUP door 13. The port plate 21 and the port door 23 form part of a wall interfacing the front end with the FOUP 10 and serve to isolate the second control space 200, which serves as a clean room and a wafer transfer space, from the ambient atmosphere 300. As shown in FIG. 4, the sensor bracket 62 has the form of a rectangular frame and surrounds the port door 23. A lower extension member 42 extends downward from the port door 23.

The port door horizontal-movement mechanism 40 includes an arm member 44 which extends perpendicular from the lower end portion of the lower extension member 42. The arm member 44 is slidably mounted in a linear guide 41 on the upper surface of a vertical-movement platform 51 of the port-door-and-sensor vertical-movement mechanism 50, which will be described later. An end of the arm member 44 is connected to an output shaft of a port door horizontal-movement mechanism drive motor 43, which moves the arm member 44 horizontally (right-and-left in FIG. 1). The arm member 44 extends through a guide slit 52 formed in the port plate 21 and extending downward from underneath an opening 22 in the port plate 21. The arm member 44 moves horizontally and vertically along the guide slit 52.

The sensor horizontal-movement mechanism 60 includes an arm member 64 which is perpendicularly attached to a lower end portion of the sensor bracket 62 and which is slidably mounted in a linear guide 61 on the lower surface of the vertical-movement platform 51 of the port-door-and-sensor vertical-movement mechanism 50, which will be described later. An end of the arm member 64 is connected to an output shaft of a sensor horizontal-movement mechanism drive motor 63, which moves the arm member 64 horizontally. As in the case of the arm member 44, the arm member 64 extends through the guide slit 52, underneath the arm member 44, and moves horizontally and vertically along the guide slit 52.

As shown in FIG. 2, the right-hand and left-hand vertical-movement platforms 51, arm members 44, and arm members 64 are located adjacent the right-hand and left-hand side edges of the port plate 21. The right-hand and left-hand vertical-movement platforms 51 are connected unitarily by means of a connection member 55 extending horizontally in FIG. 2. The connection member 55 has a nut accommodating portion 56 which houses a ball nut engaged with a screw shaft 54. As the screw shaft 54 is rotated by a servomotor 53, the nut accommodating portion 56 is caused to move vertically; i.e., the connection member 55 integral with the nut accommodating portion 56 moves vertically. The vertical movement of the connection member 55 causes the port door 23 and the sensor bracket 62 to move vertically as a unit via the paired vertical-movement platforms 51, arm members 44, and arm members 64.

As shown in FIGS. 2 and 3, the connection member 55 moves vertically along the outside surface of the port plate 21 while being guided by a guide mechanism including guide grooves 58 which are formed in the corresponding right-hand and left-hand vertical-movement platforms 51, which in turn are connected unitarily by means of the connection member 55, and which receive corresponding guide rails 57. Guide rails 57 are fixed on the outside surface of the port plate 21 adjacent the right-hand and left-hand side edges of the port plate 21 and extend vertically.

The port door horizontal-movement mechanism drive motor 43 is fixed on the upper surface of the right-hand vertical-movement platform 51 of FIG. 2, whereas the sensor horizontal-movement mechanism drive motor 63 is fixed on the lower surface of the left-hand vertical-movement platform 51 of FIG. 2. Thus, through installation of the port door horizontal-movement drive motor 43 and the sensor horizontal-movement drive motor 63 horizontally in opposition to each other, weight balance is established horizontally for a unitary assembly composed of the connection member 55, paired right- and left-hand vertical-movement platforms 51, and the motors 43 and 63. However, the motors 43 and 63 may be fixed on the upper and lower surfaces, respectively, of the right-hand or left-hand vertical-movement platform 51.

The servomotor 53, the screw shaft 54, the connection member 55 including the nut accommodating portion 56, and the paired vertical-movement platforms 51 constitute the port-door-and-sensor vertical-movement mechanism 50. As shown in FIGS. 1 and 2, the port-door-and-sensor vertical-movement mechanism 50 is on the side of the port plate 21 opposite the clean room (the second control space 200), which houses the port door 23 and the sensor bracket 62, and is housed in a drive section chamber 80.

Since the port-door horizontal-movement mechanism drive motor 43 and the sensor horizontal-movement mechanism drive motor 63 are fixed on the right- and left-hand vertical-movement platforms 51, respectively, the motors 43 and 63 are also housed in the drive section chamber 80. Also, the drive section chamber 80 houses portions of the arm members 44 of the port door horizontal-movement mechanism 40 which slide along the linear guide 41 and portions of the arm members 64 of the sensor horizontal-movement mechanism 60 which slide along the linear guide 61.

Accordingly, the drive section (which is composed of the port door horizontal-movement mechanism drive motor 43 and the linear guide 41) of the port door horizontal-movement mechanism 40, the drive section (which is composed of the sensor horizontal-movement mechanism drive motor 63 and the linear guide 61) of the sensor horizontal-movement mechanism 60, and the drive section (which is composed of the servomotor 53, the screw shaft 54, the connection member 55 including the nut accommodating portion 56, and the paired right-and left-hand vertical-movement platforms 51) of the port-door-and-sensor vertical-movement mechanism 50 are disposed opposite to the clean room 200-which houses the port door 23 and the sensor bracket 62-with respect to the port plate 21 and are thereby isolated from the clean room 200, while housed in the drive section chamber 80.

The drive section chamber 80 is equipped with a fan 81 for exhausting the atmosphere of the drive section chamber 80 to the exterior. Thus, the fan 81 exhausts dust generated from the drive section of the port door horizontal-movement mechanism 40, the drive section of the sensor horizontal-movement mechanism 60, and the drive section of the port-door-and-sensor vertical-movement mechanism 50, to the ambient atmosphere 300, thereby preventing contamination of the clean room 200 by the dust. Preferably, the fan 81 is installed on a wall of the drive section chamber 80 at the lowest possible position.

Next, the operation of the drive-section-isolated FOUP opener 1 of the present embodiment will be described in detail.

As shown in FIG. 1, the FOUP door 13 is about to be detached from the FOUP frame 11, and the port door 23 and the mapping sensor 70 are on standby. First, when the port door 23 vacuum-chucks and holds the FOUP door 13, the port door horizontal-movement mechanism 40 operates so as to retract the port door 23 horizontally. Then, the port-door-and-sensor vertical-movement mechanism 50 operates so as to lower the sensor bracket 62, together with the port door 23, to a position where the mapping sensor 70 is to enter the FOUP 10, thereby positioning the mapping sensor 70.

Next, the sensor horizontal-movement mechanism 60 operates so as to cause the mapping sensor 70 to enter the FOUP 10 independently of the port door 23. Subsequently, the port-door-and-sensor vertical-movement mechanism 50 operates so as to lower the mapping sensor 70, together with the port door 23, to the bottom wafer position. During the lowering movement, the mapping sensor 70 detects presence/absence, condition (inclined insertion, multiple insertion and other items), and position (height) of the wafers 14 contained in the FOUP 10. The results of detection are transmitted one-by-one to an unillustrated wafer transfer robot.

When the mapping sensor 70 lowers to the bottom wafer position, the sensor horizontal-movement mechanism 60 operates so as to retract the mapping sensor 70 from inside the FOUP 10 independently of the port door 23. Finally, the port-door-and-sensor vertical-movement mechanism 50 operates so as to lower and retract the port door 23 and the mapping sensor 70 in unison, thereby holding the FOUP door 13 in the front end (within the second control space 200).

The present embodiment, configured and functioning as described above, yields the following effects.

In the drive-section-isolated FOUP opener 1, the drive section of the port door horizontal-movement mechanism 40, the drive section of the sensor horizontal-movement mechanism 60, and the drive section of the port-door-and-sensor vertical-movement mechanism 50 are disposed opposite the clean room with respect to the port plate 21 and are thereby isolated from the clean room 200. Thus, the port plate 21 prevents entry into the clean room 200 of dust generated by the drive sections. For example, when a movable member actuated by a motor (the port door horizontal-movement mechanism drive motor 43, the sensor horizontal-movement mechanism drive motor 63, or the port door-and-sensor vertical-movement drive servomotor 53) of a drive section generates dust through friction, the dust is not scattered into the clean room 200. Also, an organic substance generated through vaporization of a lubricant applied to a movable member is not scattered into the clean room 200. Furthermore, when the drive sections are to be serviced for maintenance, inspection, or repairs, a worker does not need to enter the clean room 200; i.e., the worker does not need to move or remove equipment in order to establish work space within the clean room 200, thereby avoiding contamination of the clean room 200 with dust associated with such work. Therefore, the clean room 200 can maintain a high level of cleanliness.

Also, since the port door 23 is disposed within the clean room 200, the distance between the FOUP 10 and the port plate 21 can be zero or short; thus, the gap therebetween is very small, thereby avoiding entry of dust into the FOUP 10 (the first control space 100) and into the clean room 200 from outside the clean room 200 (the ambient atmosphere 300), and adhesion of dust to the inside surface of the FOUP door 13 and the outside surface of the port door 23, as well as preventing outflow of a large amount of highly clean air from the clean room 200. Thus, the clean room 200 can maintain a high level of cleanliness in a more reliable condition.

Furthermore, the port plate 21 has the guide slit 52 located underneath the opening 22, and the drive section of the port door horizontal-movement mechanism 40, the drive section of the sensor horizontal-movement mechanism 60, and the drive section of the port-door-and-sensor vertical-movement mechanism 50 move the port door 23 and the sensor bracket 62 horizontally or vertically, via the guide slit 52. Thus, entry of dust into the clean room 200 through the guide slit 52 from outside the clean room 200 and outflow of a large amount of highly clean air from the clean room 200 through the guide slit 52 can be suppressed to the greatest possible extent, thereby contributing to the maintenance of a high level of cleanliness in the clean room 200.

The arms 44 and 64 respectively connected to the port door 23 and sensor bracket 62 move along the guide slit 52 horizontally and vertically, thereby creating the possibility of generation of dust. However, the dust can be ejected to the exterior of the clean room 200 from the guide slit 52 through employment of a clean room pressure (a positive clean room pressure) higher than a pressure outside the clean room 200. Thus, this feature also contributes to the maintenance of a high level of cleanliness in the clean room 200.

Furthermore, since the right- and left-hand guide slits 52 are provided and used in common for moving the port door 23 and the sensor bracket 62, the number of guide slits 52 can be minimized to thereby enhance the aforementioned effects. Also, the drive section chamber 80 includes the fan 81 for exhausting atmosphere from the drive section chamber 80 to the exterior. Thus, entry of dust, generated by the drive sections, into the clean room 200 through the guide slits 52 can be completely prevented, thereby reliably maintaining the clean room 200 at a high level of cleanliness.

Also, since the gap between the FOUP 10 and the port plate 21 is very small, impairment of accuracy in positioning of the FOUP 10 due to machining errors, assembly errors, and wear of the dock plate 31 and components of the dock moving mechanism 30 can be avoided. Thus, the mapping sensor 70 can maintain high detection accuracy, so that the wafers 14 can be transferred with high reliability.

Furthermore, since a worker does not need to enter the clean room 200 when the drive sections are to be serviced for maintenance, inspection, or repairs, there is no need to install equipment for removing dust from the worker who is to enter the clean room 200 for performing service work, thereby lowering equipment cost.

The present invention is not limited to the above-described embodiment, but may be modified as appropriate without departing from the spirit or scope of the invention. For example, the connection member 55 and the paired right- and left-hand vertical-movement platforms 51 may be connected in such a manner that the right- and left-hand vertical-movement platforms 51 are disposed on the upper or lower surface of the connection member 55 at right- and lefthand end portions thereof, while the guide groove 58 is formed in each of right- and left-hand end portions of the connection member 55 and the right- and left-hand vertical-movement platforms 51. In this case, the vertical movement of the port-door-and-sensor vertical-movement mechanism 50 can be guided in a more reliable manner. Also, the individual drive sections may employ a power cylinder in place of the motor 43, 53, or 63, as an actuator.

What is claimed is:

1. A drive-section-isolated FOUP opener for opening and closing a FOUP door which closes a front opening of a FOUP containing a plurality of semiconductor wafers oriented horizontally and vertically arranged at predetermined intervals, said FOUP opener comprising:

a dock plate for carrying and positioning a FOUP;

a dock moving mechanism for moving said dock plate to a position for detachment and attachment of the FOUP door;

a port door including a detachment/attachment mechanism for detaching and attaching the FOUP door and a holder mechanism for holding the FOUP door;

a port plate having an opening, the opening of said port plate being closed by said port door, said port plate having a clean room side and a FOUP side;

a port door horizontal-movement mechanism for horizontally and linearly moving said port door;

a sensor horizontal-movement mechanism, mounted outside and spaced from said port door, for horizontally and linearly moving a sensor bracket, independently of said port door, between a horizontally extended position within the FOUP and a horizontally retracted position withdrawn from the FOUP, said sensor bracket having a mapping sensor mounted on an upper portion of said sensor bracket and adapted to detect presence/absence, storage condition, and position of wafers contained in the FOUP;

a port-door-and-sensor vertical-movement mechanism for vertically moving said port door and said sensor bracket with said port door holding the FOUP door; and a drive for said port door horizontal-movement mechanism, a drive for said sensor horizontal-movement mechanism, and a drive for said port-door-and-sensor vertical-movement mechanism being disposed on the FOUP side of said port plate and thereby isolating said drives from the clean room.

2. A drive-section-isolated FOUP opener according to claim 1, wherein said port plate has a vertically elongated guide slit located underneath the opening; and wherein the drive for said port door horizontal-movement mechanism, the drive for said sensor horizontal-movement mechanism, and the drive for said port-door-and-sensor vertical-movement mechanism move said port door and said sensor bracket horizontally and vertically, via said guide slit.

3. A drive-section-isolated FOUP opener according to claim 2, wherein said guide slit is used in common for moving said port door and said sensor bracket.

4. A drive-section-isolated FOUP opener according to claim 1, further comprising a drive section chamber housing the drive for said port door horizontal-movement mechanism, the drive for said sensor horizontal-movement mechanism, and the drive for said port-door-and-sensor vertical-movement mechanism, and said drive section chamber including a device for exhausting atmosphere from said drive section chamber to an exterior area.

5. A drive-section-isolated FOUP opener according to claim 2, further comprising a drive section chamber housing the drive for said port door horizontal-movement mechanism, the drive for said sensor horizontal-movement mechanism, and the drive for said port-door-and-sensor vertical-movement mechanism, and said drive section chamber including a device for exhausting atmosphere from said drive section chamber to an exterior area.

6. A drive-section-isolated FOUP opener according to claim 3, further comprising a drive section chamber housing the drive for said port door horizontal-movement mechanism, the drive for said sensor horizontal-movement mechanism, and the drive for said port-door-and-sensor vertical-movement mechanism, and said drive section chamber including a device for exhausting atmosphere from said drive section chamber to an exterior area.

7. A drive-section-isolated FOUP opener according to claim 1, wherein said port door horizontal-movement mechanism moves said port door horizontally and linearly between a closed position within said opening of said port plate and an open position spaced from said port plate on the clean room side.

8. A drive-section-isolated FOUP opener according to claim 7, wherein said port door horizontal-movement mechanism moves said port door horizontally and linearly independently of said sensor bracket.

9. A drive-section-isolated FOUP opener according to claim 1, wherein said port door horizontal-movement mechanism moves said port door horizontally and linearly independently of said sensor bracket.

10. A drive-section-isolated FOUP opener according to claim 2, wherein said port door horizontal-movement mechanism moves said port door horizontally and linearly between a closed position within said opening of said port plate and an open position spaced from said port plate on the clean room side.

11. A drive-section-isolated FOUP opener according to claim 10, wherein said port door horizontal-movement mechanism moves said port door horizontally and linearly independently of said sensor bracket.

12. A drive-section-isolated FOUP opener according to claim 2, wherein said port door horizontal-movement mechanism moves said port door horizontally and linearly independently of said sensor bracket.

13. A drive-section-isolated FOUP opener according to claim 1 wherein, in said horizontally retracted position, said mapping sensor and said sensor bracket are located on the clean room side of said port plate and spaced from said port plate.

* * * * *